TABLE TYPE RADIO CABINET

Filed April 29, 1946 3 Sheets-Sheet 1

Inventor
HAROLD RIETH.

by The Firm of Charles W. Hills Attys

TABLE TYPE RADIO CABINET

Filed April 29, 1946 3 Sheets-Sheet 2

Inventor
HAROLD RIETH.

by The Firm of Charles W. Hills
Attys

Feb. 28, 1950 H. RIETH 2,498,898

TABLE TYPE RADIO CABINET

Filed April 29, 1946 3 Sheets-Sheet 3

Inventor
HAROLD RIETH.

by The Firm of Charles W. Hills Attys

Patented Feb. 28, 1950 2,498,898

UNITED STATES PATENT OFFICE 2,498,898

TABLE TYPE RADIO CABINET

Harold Rieth, Kokomo, Ind., assignor to Kingston Products Corporation, Kokomo, Ind., a corporation of Indiana Application April 29, 1946, Serial No. 665,696

3 Claims. (Cl. 312—7)

This invention relates to a radio receiver cabinet and particularly to a radio receiver cabinet of the concealed type wherein all elements of the radio receiver, including the control elements, may be selectively positioned in a concealed position within the cabinet or in an exposed position suitable for manual operation of the radio receiver controls.

A feature of this invention is the provision of a novel and improved cabinet for radio receivers or the like having a movable wall element thereon by which the cabinet may be converted in external appearance from an attractive piece of conventional furniture having no external indications that it constitutes a radio cabinet, to a radio operating condition wherein the controls of the radio receiver are conveniently exposed for manual operation. While not limited thereto, this invention is particularly applicable to the housing of small, table-type radio receivers in a cabinet structure having an external appearance similar to that of a so-called "night table" or "occasional table."

A radio receiver cabinet constructed in accordance with this invention embodies a box-like cabinet structure which is preferably constructed so that its external appearance resembles an ordinary piece of furniture such as a night table. One of the side walls of such structure is however pivotally movable relative to the cabinet and, on the inner face of such movable side wall, the radio receiver, or at least that portion of the radio receiver bearing the control knobs for operation of the radio receiver, are secured. The movable side wall carrying the radio receiver control elements cooperates respectively with suitable stops on the cabinet to permit such side wall to be positioned either in a substantially vertical position, wherein it defines the customary side wall for the piece of furniture which the cabinet structure resembles and wherein the radio receiver is completely enclosed within the cabinet and not visible from the exterior, or in an opened position wherein the movable side wall projects angularly outwardly from the cabinet and accordingly the radio receiver control elements are moved at least partly out of the interior of the cabinet to a position where they are conveniently manually operated.

A further feature of this invention is the location of the pivotal axis for the movable side wall of the cabinet structure at a position relative to the center of gravity of the assembled side wall and radio receiver elements so that the movable side wall will be gravity biased toward either its open or its closed position, thereby completely eliminating the necessity for any springs or latches to insure the positioning of the movable side wall and assembled receiver elements in either of the desired positions.

A further feature of this invention lies in the provision of a hinge structure comprising an open ended slotted member secured to the movable side wall of the cabinet which cooperates with a fixed horizontally disposed pivot pin mounted within the cabinet structure. The length of the hinge slot is carefully proportioned so that the assembled side wall and radio receiver element may be readily removed as a unit from the cabinet structure by an angularly upward movement of the assembly from its opened position; at the same time, such hinge arrangement insures that the side wall and receiver element assembly may not be accidentally disassembled during its normal pivotal movement between its opened and closed positions relative to the cabinet.

Accordingly, it is an object of this invention to provide an improved radio receiver cabinet.

A further object of this invention is to provide an improved radio receiver cabinet of the concealed type embodying a movable wall element by which the cabinet may be selectively converted in external appearance from an ordinary piece of furniture having no visible indications of the fact that it houses a radio receiver to a radio cabinet appearance wherein the control members for the radio receiver are visible and conveniently accessible for manual operation.

A particular object of this invention is to provide an improved radio receiver cabinet which may be constructed to resemble a conventional piece of furniture in external appearance but is provided with a movable side wall upon which a radio receiver element is mounted and movable therewith from a completely enclosed position within the cabinet to an exposed position wherein the radio receiver controls may be conveniently operated.

A further object of this invention is to provide an improved radio receiver cabinet construction wherein a radio receiver is mounted upon a pivotally movable panel or side wall of a cabinet construction and the pivotal axis of the movable side wall is so located relative to the center of gravity of the assembled side wall and receiver unit so that the side wall is gravity biased to either a closed position wherein the radio receiver is completely enclosed within the cabinet or an open position wherein the control members of the radio receiver are exposed exteriorly of the cabinet for convenient manual operation thereof.

A specific object of this invention is to provide an improved hinge construction for a radio cabinet having a pivotally movable side wall upon which is mounted the radio receiver characterized by the proportioning of such hinge construction to permit convenient assemlby or disassembly of the radio receiver to the cabinet, yet preventing accidental disassembly of the radio receiver from the cabinet during the normal pivotal movement of the movable side wall relative to the cabinet.

The specific nature of the invention as well as other objects and advantages thereof will become apparent to one skilled in the art from the following detailed description of the annexed sheets of drawings which, by way of preferred example only, illustrate one specific embodiment of the invention.

Figure 3:
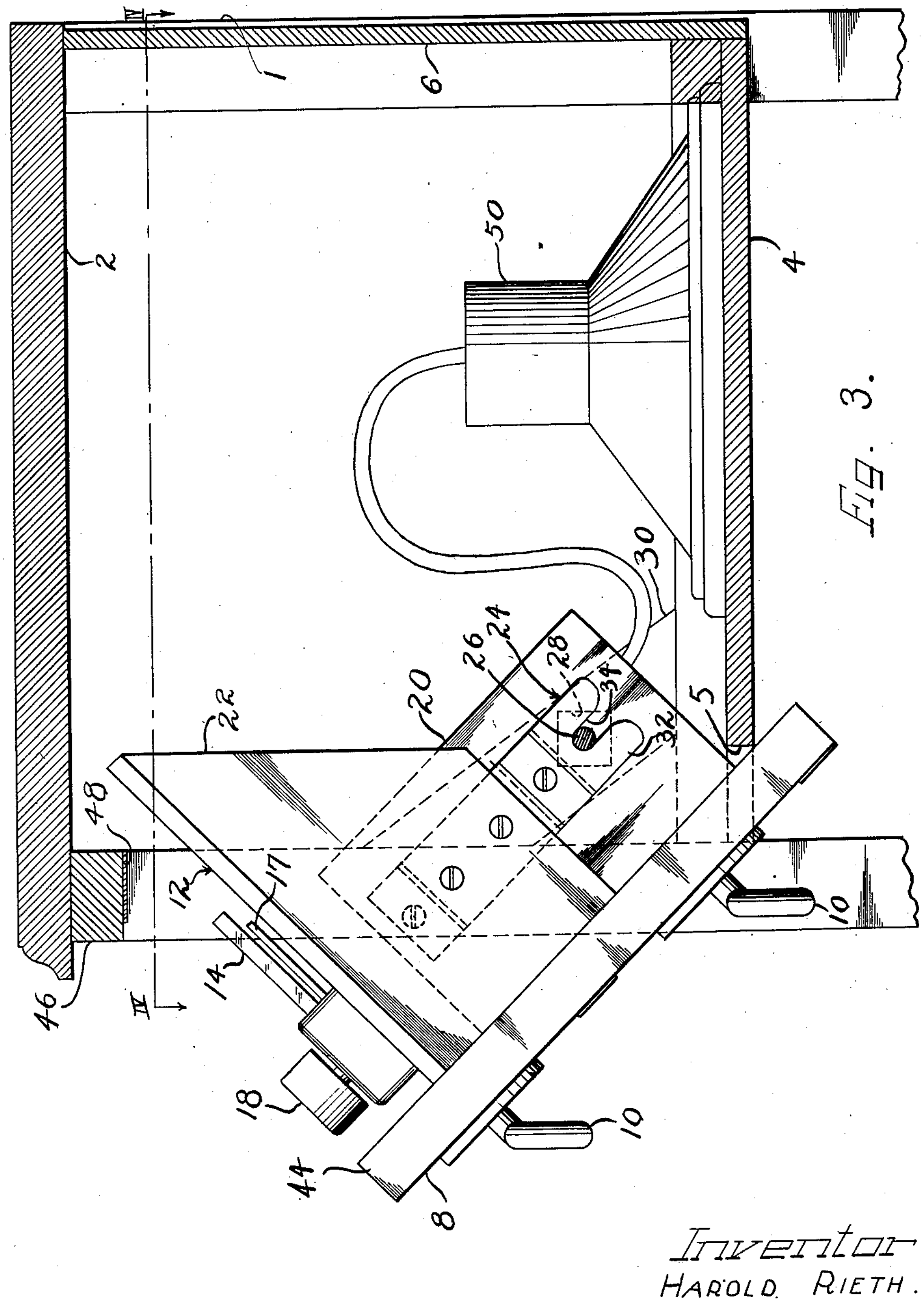
Figure 3 is an enlarged scale vertical sectional view of Figure 1.
Figure 4:
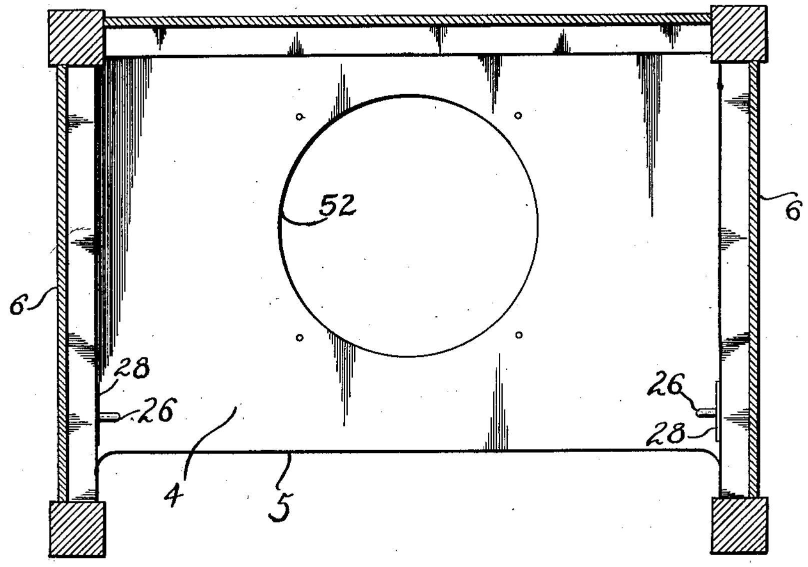
Figure 5:
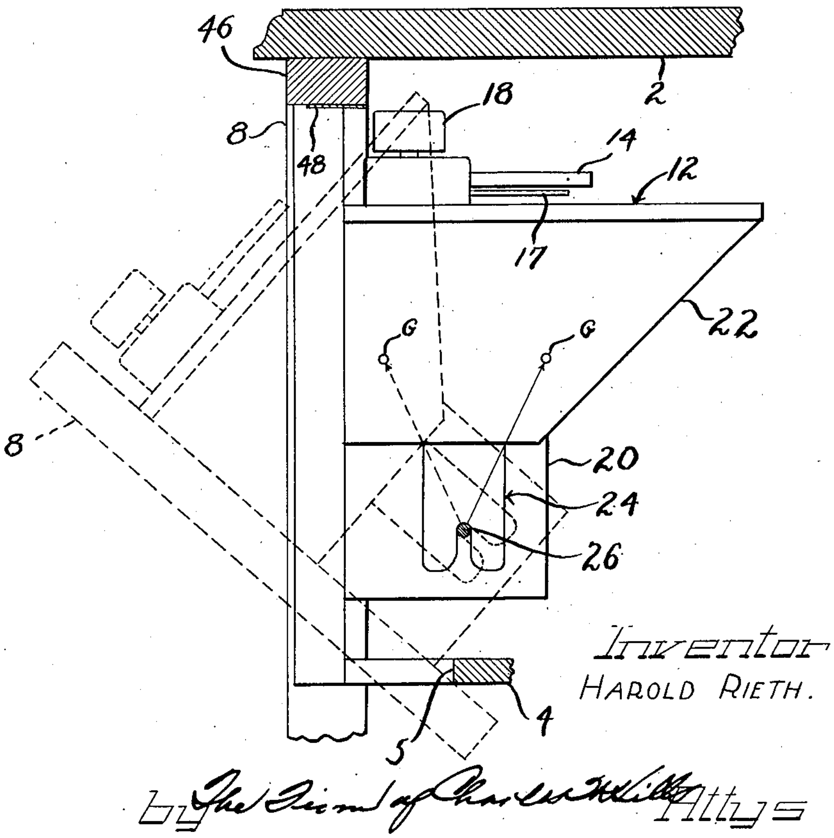

Figure 4 is a horizontal sectional view taken along the plane IV—IV of Figure 3 but with the receiver and loud speaker elements omitted for clarity; and Figure 5 is a partial sectional view, similar to Figure 3, showing the two extreme pivotal positions of the movable side wall and the relationship of the center of gravity of the assembled side wall and radio receiver with respect to the pivotal axis.

Figure 1:
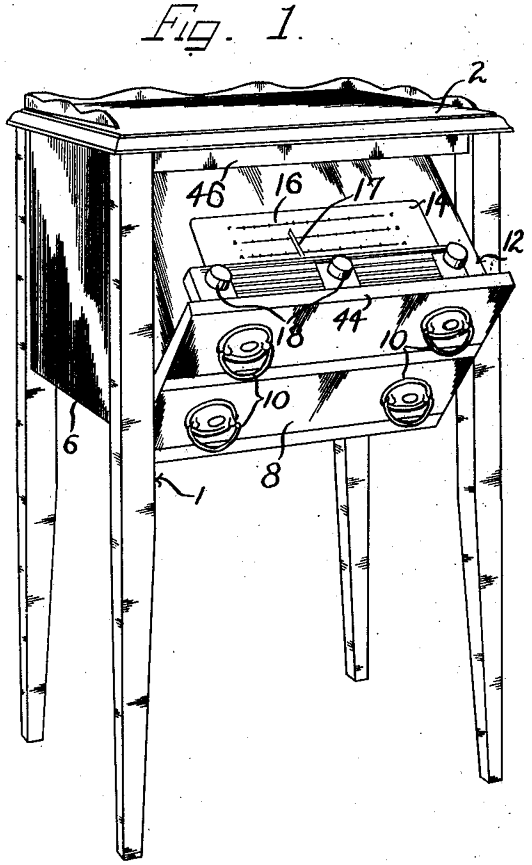
Figure 1 is a perspective view of a radio cabinet constructed in accordance with this invention showing the movable side wall element thereof in its open position wherein the control members for the radio receiver are exposed.

As shown on the drawings:

As shown in Figure 1, the numeral 1 indicates generally a radio receiver cabinet embodying this invention. While the particular cabinet style illustrated resembles in external appearance the type of furniture generally known as a night table, it should be distinctly understood that this invention is equally applicable to other types of cabinet constructions resembling other well known forms of furniture such as desks, chests of drawers, dressers, buffets, or the like. The essential characteristic of the particular cabinet structure to which this invention is applied is that it includes a top wall 2, a bottom wall 4 and a plurality of side walls 6 which define a box-like enclosure. While any one of the side walls 6 might be utilized as the movable wall or panel, I preferably utilize the front wall 8 as the movable wall of the radio cabinet construction.

The front wall 8 comprises a panel-like member and its exterior side is formed to blend with the general exterior appearance of the particular piece of furniture which it is desired that the cabinet construction simulate. For example, the exterior surface of the front wall 8 may be provided with a plurality of drawer pulls 10 which, when the movable side wall 8 is disposed in a vertical position, yields the identical external appearance of a night table having a pair of drawers. The movable front wall 8 is of course pivotally secured to the cabinet structure by means that will be described in detail later.

The control panel 12 of a radio receiver is mounted on the back surface of the movable front wall 8 by any suitable means and is preferably disposed adjacent the top edge of front wall 8 and lies in a plane substantially perpendicular to front wall 8. The control panel 12 may comprise any one of several well known forms and for purposes of example has been illustrated as including an upstanding transparent dial plate 14, upon which suitable tuning indications 16 are engraved and along which a tuning indicator 17 is moved by operation of the tuning mechanism of the radio receiver. Suitable control knobs 18 are also provided on control panel unit 12. Such knobs may comprise the tuning control, the off-on control, volume control, tone control, etc.

If desired, the chassis 20 containing the electrical elements of the radio receiver may also be mounted on the back face of front wall 8 in a position below and behind control panel unit 12. It will, of course, be apparent to those skilled in the art that control panel unit 12 and chassis 20 may be unitarily mounted in a single casing if so desired.

To support the control panel unit 12 and further to provide a convenient point for attachment of a hinge element, a pair of plate-like frame members 22 are provided respectively at each end of the control panel unit 12 and are suitably secured to the control panel unit 12 and to the back face of the front wall 8.

The pivotal mounting of front wall 8 to the cabinet is accomplished by the cooperation of a pair of hinges 24, which are respectively secured to the frame members 22, with a pair of pivot pins or studs 26 which are respectively mounted within the cabinet in spaced opposed relationship on opposite side walls 6. Each of the pivot pins 26 is formed integral with, or rigidly secured to, a mounting plate portion 28. Plate portion 28 is in turn secured by suitable screws (not shown) to angularly disposed corner brace frame members 30 (Figure 3) located in each of the side walls 6 adjacent the front wall opening of the cabinet.

Figure 2:
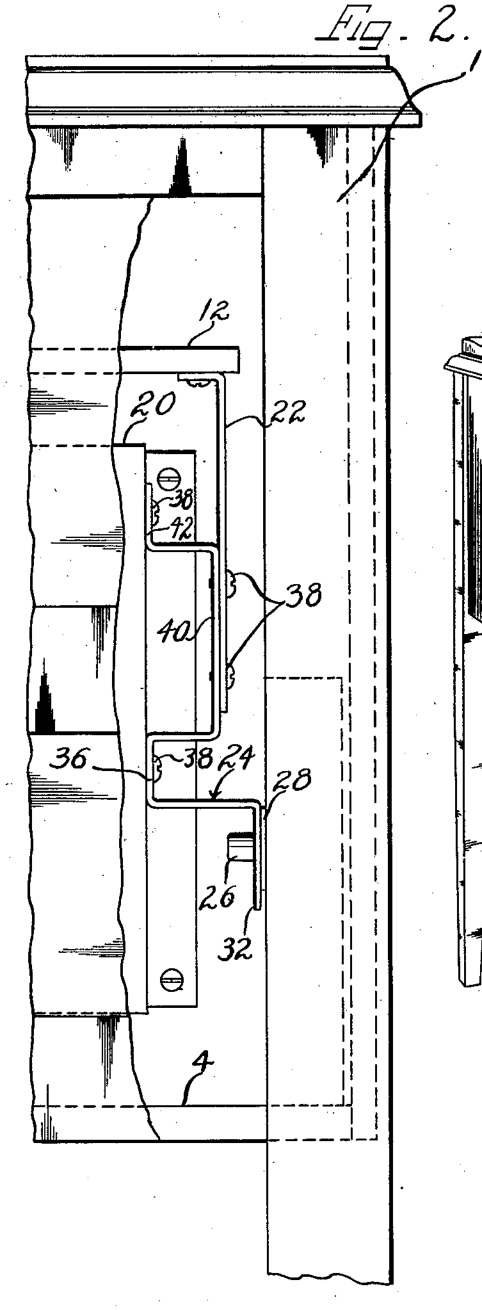
Figure 2 is an enlarged scale, fragmentary, front elevational view, partly broken out, of the radio receiver of Figure 1, with the movable side wall disposed in its closed position.

Each of the hinges 24 are identical and comprise a metallic strip which is serpentinely bent to afford contact with the corresponding pivot pin 26, frame member 22 and the adjacent side of the chassis 20. The bottom end portion 32 of hinge 24 is disposed in a generally vertical plane and is provided with a slot 34 which is open at its bottom and which receives the corresponding pivot pin 26 therein. Next, the hinge 24 is bent transversely inward to extend adjacent the side wall of chassis 20 and then bent back into the vertical plane to define a foot portion 36 (Figure 2) which is secured to chassis 20 by a suitable screw 38. The hinge is again bent transversely extending back toward frame member 22 and thence bent to lie in a vertical plane to define a portion 40 which is secured to the adjacent frame member 22 by screws 38. Lastly, the hinge 24 is again bent transversely in a direction toward the chassis 22 and then bent back again into a vertical plane to define another foot portion 42 which is secured to chassis 20 by the screw 38. From the described construction, it will be apparent that both the movable front wall 8 and the radio receiver element assembled thereon are rigidly secured to hinge 24 and thus the assembly pivots as a unit about the pivot pin 26.

The location of pivot pin 26 is so arranged relative to the movable front wall 8 that as the front wall 8 pivots about the pin 26, the front wall will attain a substantially vertical position illustrated in the full lines in Figure 5. At this point the top edge 44 of front wall 8 contacts the bottom surface of a horizontally extending frame member 46 of the cabinet 1 which supports the top wall 2. Since the edge 44 of front wall 8 is visible when the front wall is in its open position, it is desirable that the finish on such top edge be preserved. Accordingly, a strip of compressible material 48, such as felt or rubber, is provided on the underside of frame member 46 to cushion the impact of the edge 44 of front wall 8 thereagainst.

Accordingly, it is apparent that the clockwise pivotal movement of front wall 8, as viewed in Figures 3 and 5, is definitely limited in one direction to the vertical position of such front wall by the engagement of front wall 8 with frame member 46. In such vertical position, it will be noted that all of the radio receiver elements including the radio chassis 20 and the control panel unit 12 are completely enclosed within the cabinet 1 and hence the exterior appearance of the cabinet 1 is identical with that of the particular piece of furniture which it is constructed to resemble. There is no external indication that the cabinet 1 is actually a radio receiver cabinet.

To limit the counterclockwise pivotal movement of front wall 8 and the elements assembled thereto, the front edge 5 of bottom wall 4 of the cabinet is cut back somewhat so as to contact the lower rear surface of front wall 8 when front wall 8 is disposed in a position projecting angularly outwardly from the front of the cabinet 1. The point of contact between the front wall 8 and the front face 5 of bottom wall 4 is preferably arranged to occur when the control panel unit 12 is brought far enough out of the interior of the cabinet 1 to permit the dial plate 14 to be conveniently visible and the control knobs 18 to be conveniently manually operable.

It is obviously desirable that the radio chassis 20 and the control panel unit 12 be removable as a unit from the interior of cabinet 1 for servicing or similar purposes. The construction embodying this invention may be readily proportioned to provide an immediate disassembly arrangement without impairing the pivotal movement of the front wall 8 during normal manipulation of the cabinet structure between its open and closed positions. It will be noted from Figure 3 that the front wall 8 and the radio receiver elements assembled thereon may be removed as a unit from the cabinet 1 merely by imparting an angularly upward movement to the assembly. By proportioning the length of the hinge slots 34 to be less than the clearance between the control panel unit 12 and the adjacent elements of the radio cabinet 1 in the line of disassembly movement, the front wall 8 and its assembled elements may be moved angularly upwardly to bring the end of the hinge slots 34 off the pivot pin 26, whereupon the front wall assembly unit may be removed from cabinet 1 by a generally horizontal movement of such assembly, possibly accompanied by a slight rotational movement to clear the horizontal frame member 46. Assembly of the front wall 8 and its associated units, of course, is accomplished by reversing the disassembly movement. It should be particularly noted that, irrespective of the fact that the radio receiver elements may be quickly removed from the cabinet 1, there is no tendency for accidental disassembly of the front wall 8 and its associated elements to occur during the normal pivotal movement of the front wall 8 between its open and closed positions.

While the loud speaker of the radio receiver may be mounted in any convenient place within the cabinet 1 and of course may be mounted on the movable front wall 8, to assure uniformity of acoustic properties during operation of the receiver in either the open or closed position, it is preferable to mount the loud speaker in surrounding relationship to an aperture in the bottom wall 4. Accordingly, a suitable aperture 52 is provided in bottom wall 4 (Figure 4) and the loud speaker 50 is mounted on bottom wall 4 in surrounding relationship to aperture 52.

As a further feature of this invention, the location of the pivot pin 26 is carefully selected with reference to the positions of the center of gravity of the movable front wall 8 and the elements assembled thereon in the open and closed positions of such front wall. As illustrated in Figure 5, the pivot pins 26 are located in cabinet structure 1 so as to lie below the center of gravity G of the movable front wall 8 and its associated elements in both positions of such elements. Furthermore, the axis of pivot pins 26 is located in a vertical plane lying intermediate the respective positions of the center of gravity G of the movable front wall 8 and its associated elements in their open and closed positions. With such arrangement, the movable front wall 8 and its associated elements are gravity biased into both of its extreme positions, and having once been moved to either position, or to a point off-center with respect to the pivot pins 26, will remain in such position without requiring the use of latches, springs or the like.

It is therefore apparent that a radio cabinet embodying this invention provides a novel and improved construction whereby the cabinet may be made to resemble any desired form of conventional furniture and in its closed position will present an identical external appearance to such conventional furniture, while in its open position, the control members for the radio receiver are conveniently exposed for visual observation and manual operation.

It will, of course, be understood that various details of construction may be varied through a wide range without departing from the principles of this invention and it is, therefore, not the purpose to limit the patent granted hereon otherwise than necessitated by the scope of the appended claims.

I claim as my invention:

1. In combination, a box-like cabinet having top, bottom and side walls and an open front wall, a plate-like closure for said open front wall, means for pivotally supporting said closure on said cabinet for pivotal movement about a substantially horizontal axis parallel to the general plane of said plate-like closure, said pivotal axis being located above and to the rear of the front edge of said bottom wall to permit said closure to pivot to a substantially vertical position wherein it defines a front wall for said cabinet, stop means on said cabinet for preventing further pivotal movement of said closure in the direction past said vertical position, said bottom cabinet wall having a portion thereof disposed in the path of pivotal movement of said closure in the opposite direction, thereby positioning said closure in an outwardly projecting position relative to said cabinet, and a radio receiver element secured to the inner face of said closure member and movable therewith from an enclosed position within said cabinet to an exposed position projecting at least partly out of said cabinet in a manually accessible position.

2. In combination, a box-like cabinet having top, bottom and side walls and an open front wall, a plate-like closure for said open front wall, means for pivotally supporting said closure member on said cabinet for pivotal movement about a substantially horizontal axis parallel to the general plane of said plate-like closure, said pivotal axis being located above and to the rear of the front edge of said bottom wall to permit said closure to pivot to a substantially vertical position wherein it defines a front wall for said cabinet, stop means on said cabinet for limiting further pivotal movement of said closure in the direction past said vertical position, said stop means including a cushioning element, said bottom cabinet wall having a portion thereof disposed in the path of pivotal movement of said closure in the opposite direction, thereby positioning said closure in an outwardly projecting position relative to said cabinet, and a radio receiver element secured to the inner face of said closure member and movable therewith from an enclosed position within said cabinet to an exposed position projecting at least partly out of said cabinet, said pivotal axis being further located below and in a vertical plane intermediate the respective positions of the center of gravity of said assembled closure and receiver element when said closure member is disposed at either of its limiting pivotal positions.

3. A radio receiver comprising a cabinet having an open side wall and a bottom wall, a closure member for said open side wall extending below the plane of said bottom wall, a radio chassis assembled on said closure member, said radio chassis having a manually operable control member, means for pivotally mounting said assembled chassis and closure member to said cabinet for movement about a substantially horizontal axis, said axis being spaced above and to the rear of the front edge of said bottom wall, said closure member being constructed and arranged relative to said pivotal axis to move into a closed position substantially closing said open side wall with said radio chassis disposed within said cabinet, means for limiting further pivotal movement of said closure member into said cabinet, said bottom wall having a portion thereof disposed in the path of pivotal movement of the bottom portions of said closure member for limiting outward movement of said closure member relative to said cabinet at a point where said manual control member is disposed in a manually accessible position externally of said cabinet, said pivotal axis being located below and in a vertical plane intermediate the respective locations of the center of gravity of said assembled chassis and closure member in said open and closed positions, whereby said closure member is gravity biased to either of its extreme positions.

HAROLD RIETH.

REFERENCES CITED

The following references are of record in the file of this patent:

UNITED STATES PATENTS

| Number | Name | Date |
|---|---|---|
| 1,738,172 | Judson et al. | Dec. 3, 1929 |

FOREIGN PATENTS

| Number | Country | Date |
|---|---|---|
| 253,348 | Great Britain | June 17, 1926 |